United States Patent [19]
Hashimoto

[11] Patent Number: 5,880,703
[45] Date of Patent: Mar. 9, 1999

[54] APPARATUS FOR DISPLAYING INDIVIDUAL TELEVISION PROGRAMS OR THE LIKE

[75] Inventor: Kazuo Hashimoto, Tokyo, Japan

[73] Assignee: Hashimoto Corporation, Tokyo, Japan

[21] Appl. No.: 324,867

[22] Filed: Oct. 18, 1994

Related U.S. Application Data

[63] Continuation of Ser. No. 82,524, Jun. 25, 1993, abandoned, which is a continuation of Ser. No. 699,624, May 15, 1991, abandoned.

[30] Foreign Application Priority Data

May 18, 1990 [JP] Japan .................................. 2-128859

[51] Int. Cl.⁶ .................................................... G09G 5/00
[52] U.S. Cl. ................................ 345/2; 345/169; 348/734
[58] Field of Search ..................................... 359/142–146; 379/361; 358/194.1, 93; 368/10, 13, 41, 43, 44; 340/711; 49/29; 345/156, 168, 169, 901, 1, 2; 348/734; H04N 5/44

[56] References Cited

U.S. PATENT DOCUMENTS

| | | | |
|---|---|---|---|
| 3,337,992 | 8/1967 | Tolson | 49/29 |
| 4,079,413 | 3/1978 | Yamashita | 358/93 |
| 4,162,610 | 7/1979 | Levine | 368/41 |
| 4,511,259 | 4/1985 | Horiuchi | 368/41 |
| 4,534,012 | 8/1985 | Yokozawa | 368/10 |
| 4,540,851 | 9/1985 | Hashimoto | 358/335 |
| 4,718,112 | 1/1988 | Shinoda | 359/146 |
| 4,755,883 | 7/1988 | Uehira | 358/194.1 |
| 4,769,836 | 9/1988 | Aihara | 379/361 |
| 4,853,682 | 8/1989 | Asano et al. | 345/169 |
| 4,888,610 | 12/1989 | Tsujimoto et al. | 340/711 |
| 4,899,370 | 2/1990 | Kameo et al. | 358/194.1 |
| 4,905,212 | 2/1990 | Wakahara | 368/10 |
| 4,980,676 | 12/1990 | Nomura et al. | 340/711 |
| 5,012,229 | 4/1991 | Lenhon et al. | 368/10 |
| 5,050,138 | 9/1991 | Yamada et al. | 368/13 |
| 5,093,813 | 3/1992 | Levine | 368/41 |
| 5,179,439 | 1/1993 | Hashimoto | 348/731 |

FOREIGN PATENT DOCUMENTS

| | | |
|---|---|---|
| S57-122381 | 7/1982 | Japan . |
| S60-23008 | 2/1985 | Japan . |
| S60-220892 | 11/1985 | Japan . |
| S61-31986 | 2/1986 | Japan . |
| S61-43023 | 3/1986 | Japan . |
| H2-48879 | 2/1990 | Japan . |

*Primary Examiner*—Chanh Nguyen
*Attorney, Agent, or Firm*—Lowe, Price, LeBlanc & Becker

[57] ABSTRACT

In an apparatus which previously displays a television program or the like most desired for each person on an individual timetable, or enables the family to look at the TV channel number displayed on the timetable, it provides means for storing data of the timetable for one day or a week into a storage device, such as a wrist watch, to be always carried by each person and for displaying the data by pressing the button of the wrist watch as occasion demands. Accordingly, a viewer can find on which channel the most desired program is aired by pressing the button of the wrist watch while he/she is out or is at work, whereby he/she can watch the program on the nearest television.

9 Claims, 9 Drawing Sheets

| | | |
|---|---|---|
| 50 — DATA INITIATING MARK | | FD (HEXADECIMAL) |
| 51 — DATA NUMBER | | 1 |
| 52 — PROGRAM NUMBER | | 1 |
| 53 — CHANNEL NUMBER | | 4 |
| 54 — START TIME OF VIDEO RECORDING | | 10 / 30    10:30 |
| 55 — FINISH TIME OF VIDEO RECORDING | | 11 / 30    11:30 |
| 56 — A DAY OF THE WEEK | | 7    SUNDAY |
| 57 — DAILY OR WEEKLY | | 2    WEEKLY(1=DAILY) |
| 58 — STANDARD OR TREBLED SPEED | | 2    TREBLED SPEED |
| 59 — DATA END MARK | | FF (HEXADECIMAL) |

Fig. 5

Fig. 5-1
{
1 ----- MONDAY
2 ----- TUESDAY
3 ----- WEDNESDAY
4 ----- THURSDAY
5 ----- FRIDAY
6 ----- SATURDAY
7 ----- SUNDAY
}

APPARATUS FOR DISPLAYING INDIVIDUAL TELEVISION PROGRAMS OR THE LIKE

This application is a continuation of application Ser. No. 08/082,524 filed Jun. 25, 1993, now abandoned, which is a continuation of application Ser. No. 07/699,624 filed on May 15, 1991, now abandoned.

BACKGROUND OF THE INVENTION

The present invention relates to an apparatus for displaying the most desired individual program in order of time, selected from among all the TV programs or the like aired through mass communication media.

There are known apparatus for selecting the most desired program for each viewer/auditor from among all the TV programs or the like aired through mass communication media. However, the only clue for finding the contents of the data displayed is to look at the TV channel number indicated on a display of such an apparatus. Therefore, when an individual person wishes to know the most desired program while the person is not at home, he/she will have to call his/her own hone by telephone, asking someone to confirm the program. Even when the VCR installed at home is controlled so as to videotape a desired program via a telephone line, there was no way to confirm the program other than looking at a timetable by carrying it all the time.

SUMMARY OF THE INVENTION

In view of the foregoing problems, an object of the present invention is to provide a means of enabling to display the most desired program automatically on a display of a wrist watch or what is similar to a portable timepiece at that particular time while the user is not at home by copying the contents of data stored in an apparatus via infrared rays or by radio into a storage device of the user's wrist watch once a day or week, whereby the contents thereof can be displayed for checking as occasion demands at the place where the user is staying.

BRIEF DESCRIPTION OF THE DRAWINGS

FIG. 2-1 is an enlarged view of an operating unit of the timepiece.

FIGS. 5 and 5-1 are a diagram illustrating the contents of the TV program reservation data received on the part of the timepiece.

DESCRIPTION OF THE PREFERRED EMBODIMENTS

A description will subsequently be given of an embodiment of the present invention with reference to its constitution and function.

The present invention is an improvement of Japanese Patent Application No. 63-253131 (hereinafter called the earlier application) whose applicant is same as that of the present invention. In the block diagram of FIG. 1, reference numeral 1 denotes a VCR (Video Tape Recorder) and reference numeral 2 a display built in the VCR. Reference numeral 3 denotes a personal computer (hereinafter called PC). Reference numeral 4 denotes a disk for storing long-term TV program reservation data and programs for controlling the data. An interface 5 mainly comprises IC No. 8255 and is used for allowing the channel and time data displayed on the display 2 to be read by the PC 3 via the interface 5. Also, an interface 6 comprises components similar to those of the interface 5 and used for sending the pertinent channel data to a display unit 7 (described later) when registered time for the program loaded in the PC 3 is reached according to the data fed from the disk 4. The display unit 7 comprises a light emitting diode for displaying numbers, a decoder, a latch and the like so as to display the aforementioned channel data on a user basis, for instance, a display 7-1 for the father of a family, a display 7-2 for the mother, a display 7-3 for the child. A phototransistor 7-4 and a light emitting diode 7-5 are used for transmitting and receiving signals to and from a timepiece 9, which will be described later. As will be described later in detail, the timepiece 9 also comprises a light emitting diode 9-1 and a phototransistor 9-2 for transmitting and receiving signals.

Figure 1:
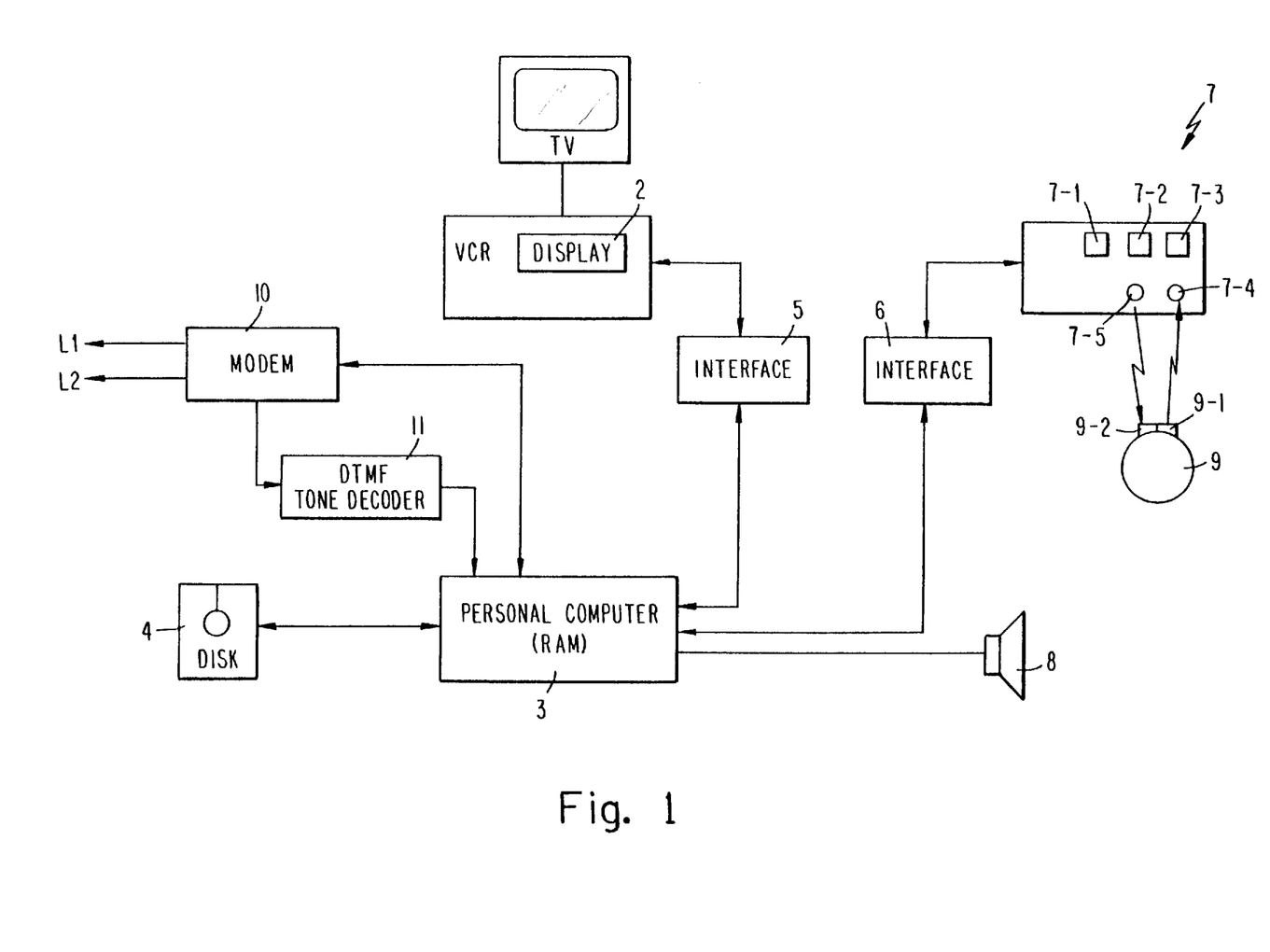
FIG. 1 is a block diagram illustrating the principle of the present invention.

As a detailed description has already been given of the operation of this apparatus in the earlier application, its operation will be briefly described herein. The PC 3 utilizes a built-in timepiece (not shown) to read the program reservation data from the disk 4 at predetermined time intervals so as to transfer the contents of the data to the memory of PC 3 (not shown). In this embodiment, the program reservation data is to be read at intervals of 24 hours and when the timepiece indicates 0000 hours, the PC 3 reads such program reservation data for one day from the disk 4. When the time indicated by the timepiece in the PC 3 coincides with the time at which the program reservation data is initiated, the PC reads the pertinent channel number out of the program reservation data and also retrieves data on whose data it is. The PC 3 then has one of the displays 7-1, 7-2 and 7-3 of the display unit 7 indicate the channel via the interface 6, and also makes a speaker 8 sound an alarm for a few seconds to inform those people around the display that the broadcasting time has arrived. If the family wish to videotape the TV program through that channel, they may manually set the VCR 1 to video recording.

A description will subsequently be given of another embodiment in the earlier application.

In this case, several programs are manually registered in the VCR 1 beforehand. As a standard VCR is capable of registering eight programs, a plurality of reservation buttons (not shown) attached to the VCR 1 are pressed to feed, in a manner publicly known, program numbers, channels, the time at which each video recording is to be started and terminated, information about video recording to be made daily, weekly or on a day-of-the week basis. In addition, whether the tape speed is standard (S.P.) or trebled (L.P.) is also fed. These items to be input are made confirmable as they are indicated on the display 2. The data thus displayed for confirmation is transferred via the interface 5 to the memory of the PC 3 and the data, such as channel number and data on whose data it is, retrieved from reservation data is displayed on the display unit as described above.

In the earlier application, the user may wish to know the most desired program while he/she is out. To satisfy the above necessity, it is so arranged in the present invention that the program reservation data is transferred to the built-in memory of the timepiece 9 and indicated on the display of the timepiece for confirmation.

Figure 2:
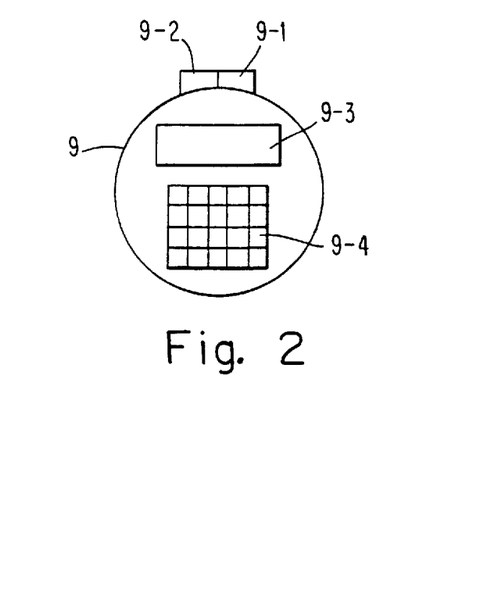
FIG. 2 is a diagram illustrating the exterior of a timepiece capable of receiving TV program reservation data.

The operation of the present invention will subsequently be described in concrete. FIG. 2 shows the exterior of a timepiece which comprises the aforementioned light emitting diode 9-1 for emitting an instruction signal in the form of an infrared ray, the phototransistor 9-2 for receiving the coded infrared ray, a display 9-3 for alternatively indicating time as the timepiece and program reservation data, and an operating button unit 9-4. FIG. 2-1 is a partial enlarged view of the operating button unit. With reference to FIG. 2-1, the coded infrared ray is emitted from the light emitting diode 9-1 to provide instructions when a button ⊡ 20 is pressed. When a button ⊡ 25 is then pressed within a predetermined time period, an instruction for demanding the transmission of program reservation data for the father of a family, for instance, is issued. When a button ⊡ 26 is otherwise pressed within the predetermined time period, an instruction for demanding the transmission of program reservation data for the mother, for instance, is issued (an instruction mode). After the instruction is thus transmitted, the program reservation data stored in the memory (not shown) of the PC 3 is copied (transferred) into the memory (RAM 2 of FIG. 3) of the timepiece 9 via the light emitting diode 7-5 and the phototransistor 9-2 of FIG. 1 (See FIGS. 1 and 2) (a reception mode).

Figure 5:
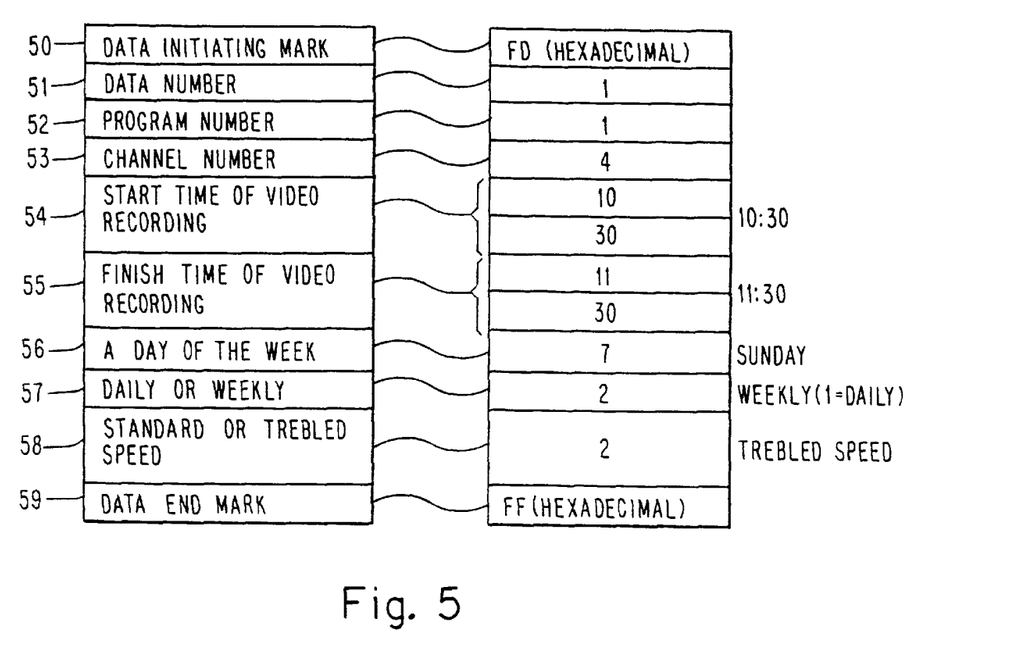

A data display button 21 is used to confirm the program reservation data thus copied into the memory of the timepiece as described above. When the button ⊡ 25 is pressed within the predetermined time period after the button 21 is pressed, data for the father is displayed (a display mode). A button ⊞ 22 or a button ⊟ 23 is used for switching the aforementioned display over to the following or preceding one. Although a program "No." (number) shown in FIG. 5 is first indicated, for instance, the following channel is indicated if the button ⊞ is pressed once and if the button ⊟ is pressed in this state, the preceding program "No." is indicated. The program "No." refers to one of the numbers attached in order when desired programs are registered.

A button ⊡ 24 is used for switching the aforementioned display over to time indication (a clock mode).

Figure 3:
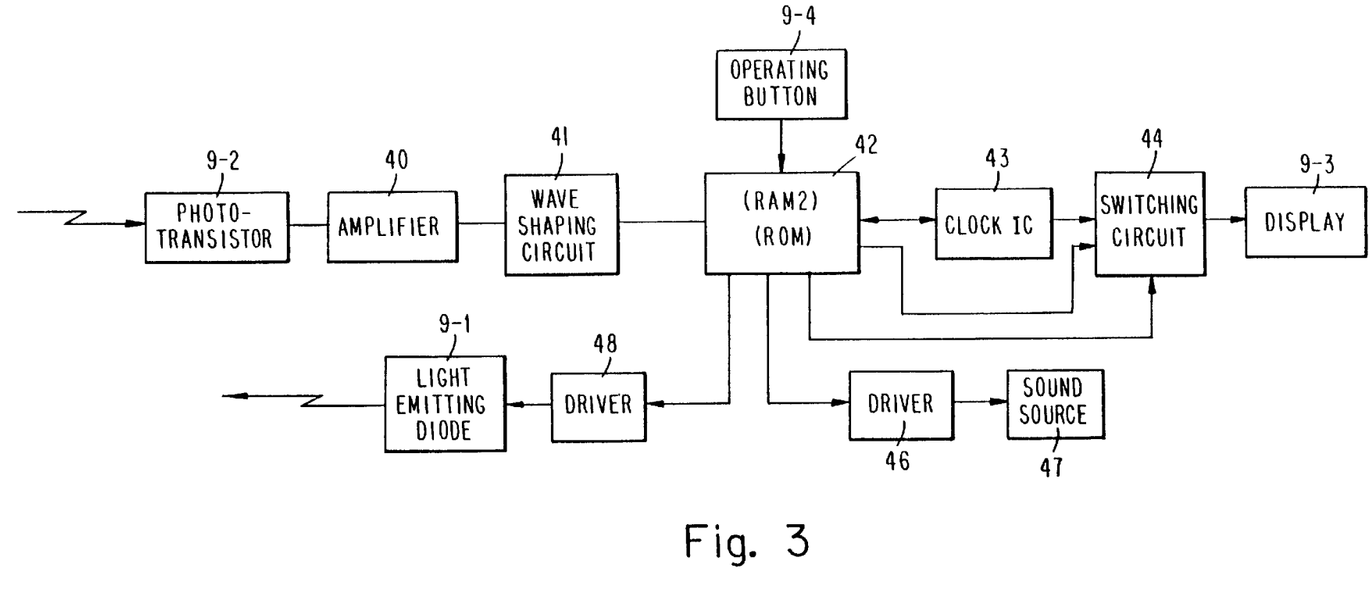
FIG. 3 is a block diagram of the interior of the timepiece.

FIG. 3 is a block diagram illustrating the interior of the timepiece having the aforementioned phototransistor 9-2. In the aforementioned reception mode, the coded infrared ray received by the phototransistor 9-2 is amplified by an amplifier 40 and the waveform is shaped by a waveform shaping circuit 41 before being input to one-chip microprocessor CPU 42. The contents of the data are then stored in the memory RAM 2 in predetermined order as shown in FIG. 5, which will be described later, according to the program stored in the ROM.

In the aforementioned instruction mode, the predetermined coded signal is transmitted via the CPU 42, a driver 48 and the light emitting diode 9-1 according to the program.

In the aforementioned display mode, moreover, the program reservation data stored in the memory RAM 2 is read according to the program and displayed on the display 9-3 via a switching circuit 44 (though a clock IC is not outputted to the displace 9-3 then because of the switching circuit 44).

In the aforementioned clock mode, instructions for time setting can be sent via the CPU 42 to the clock IC 43 by pressing a plurality of clock buttons (not shown) in the operating button unit and time data from the clock IC 43 is displayed on the display 9-3 via the switching circuit 44.

Figure 4:
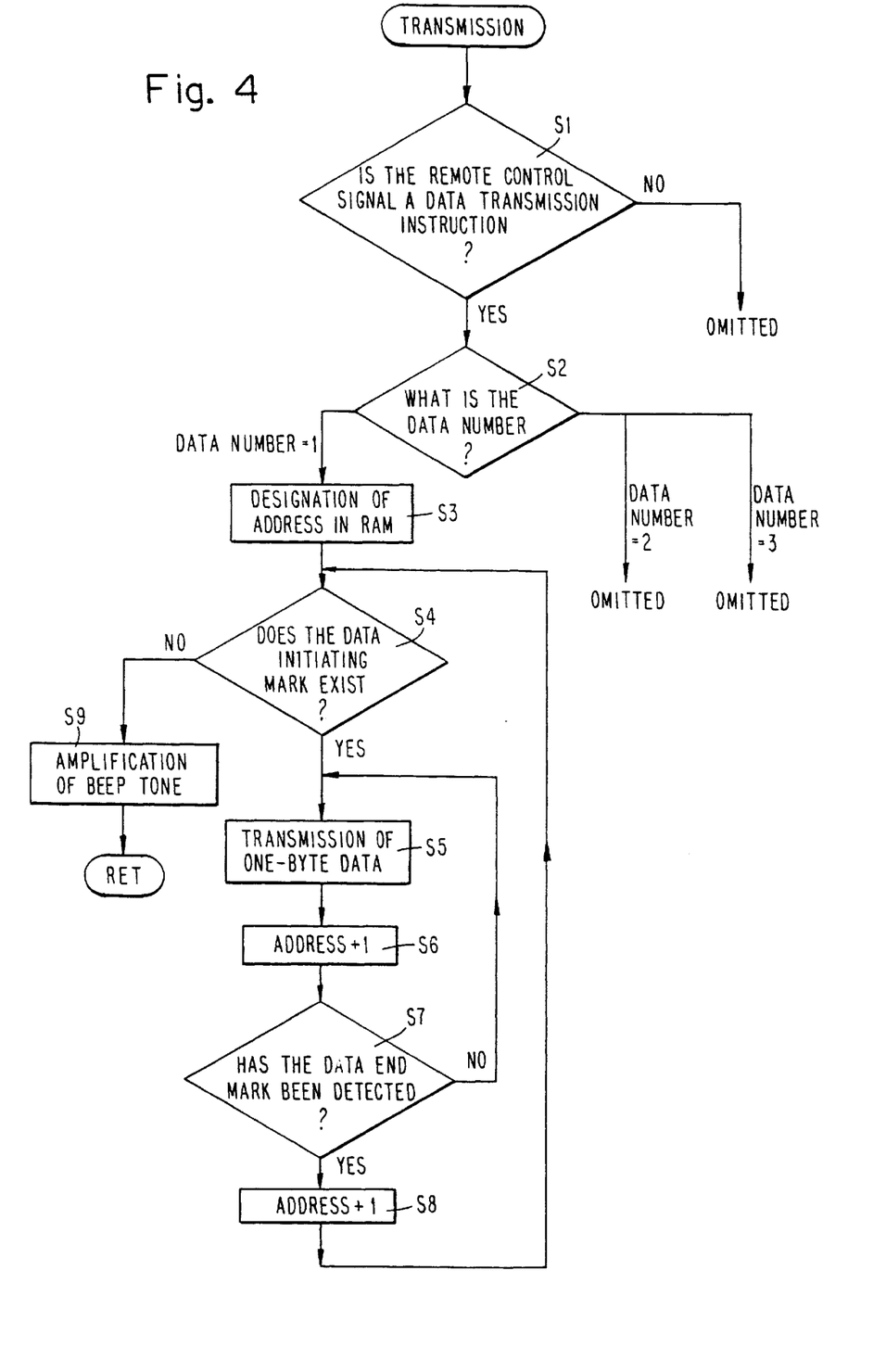
FIG. 4 is a flowchart illustrating the operations performed when TV program reservation data is transmitted from a personal computer to the timepiece.
Figure 6:
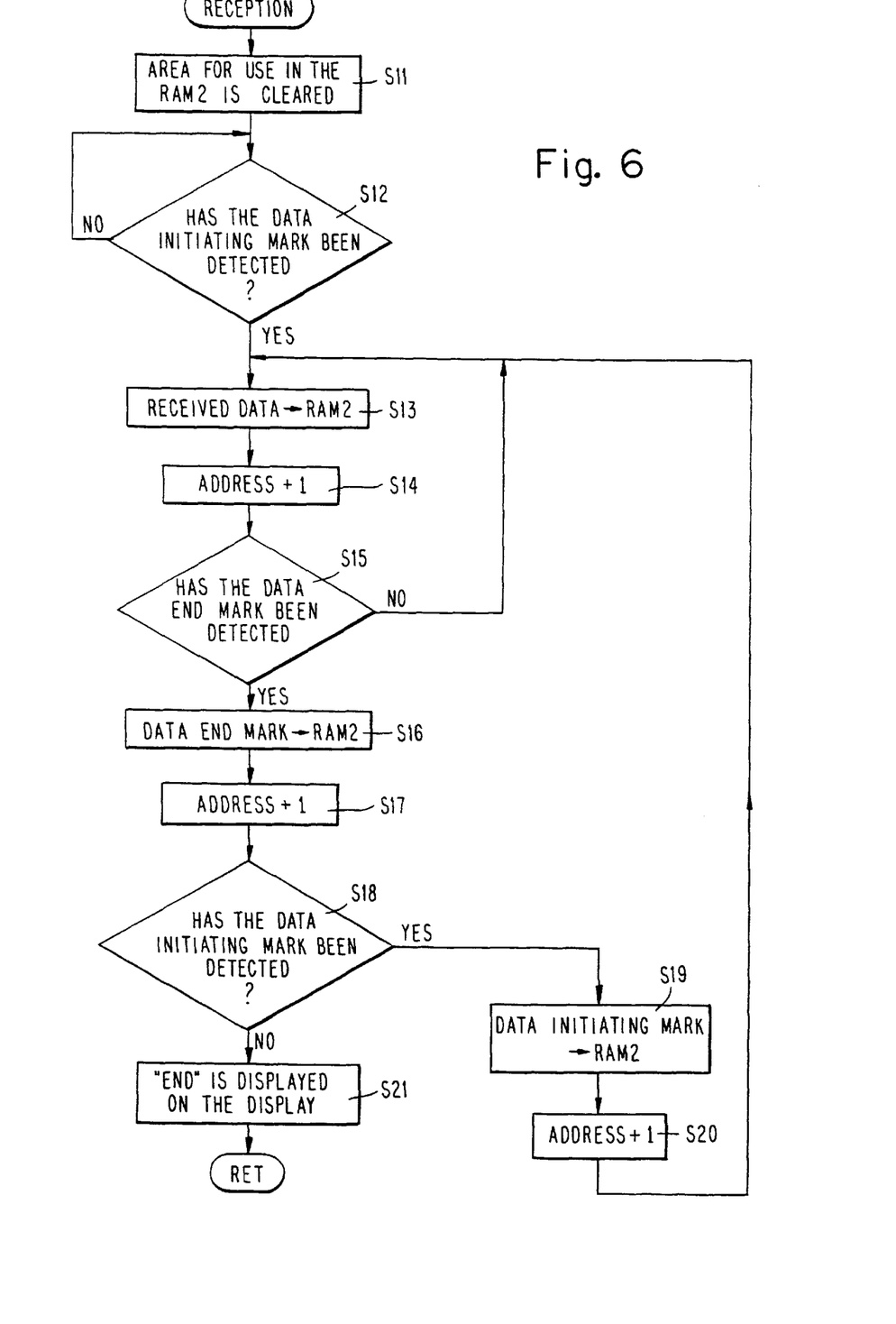
FIG. 6 is a flowchart illustrating the operations performed when TV program reservation data is received on the part of the timepiece.
Figure 7A:
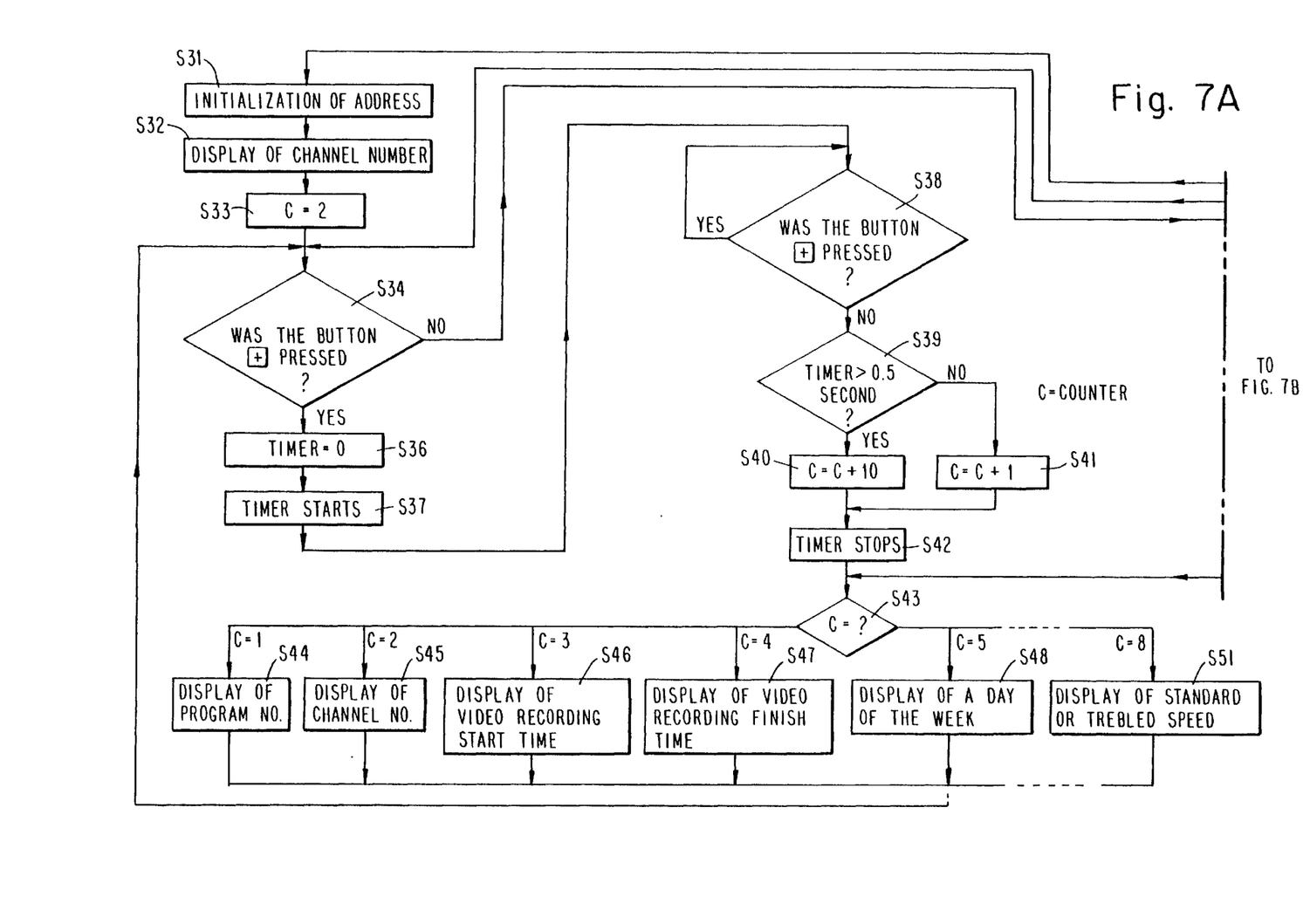
FIG. 7 is a flowchart illustrating the operations performed when the TV program reservation data thus received is confirmed by means of the display of the timepiece.
Figure 7B:
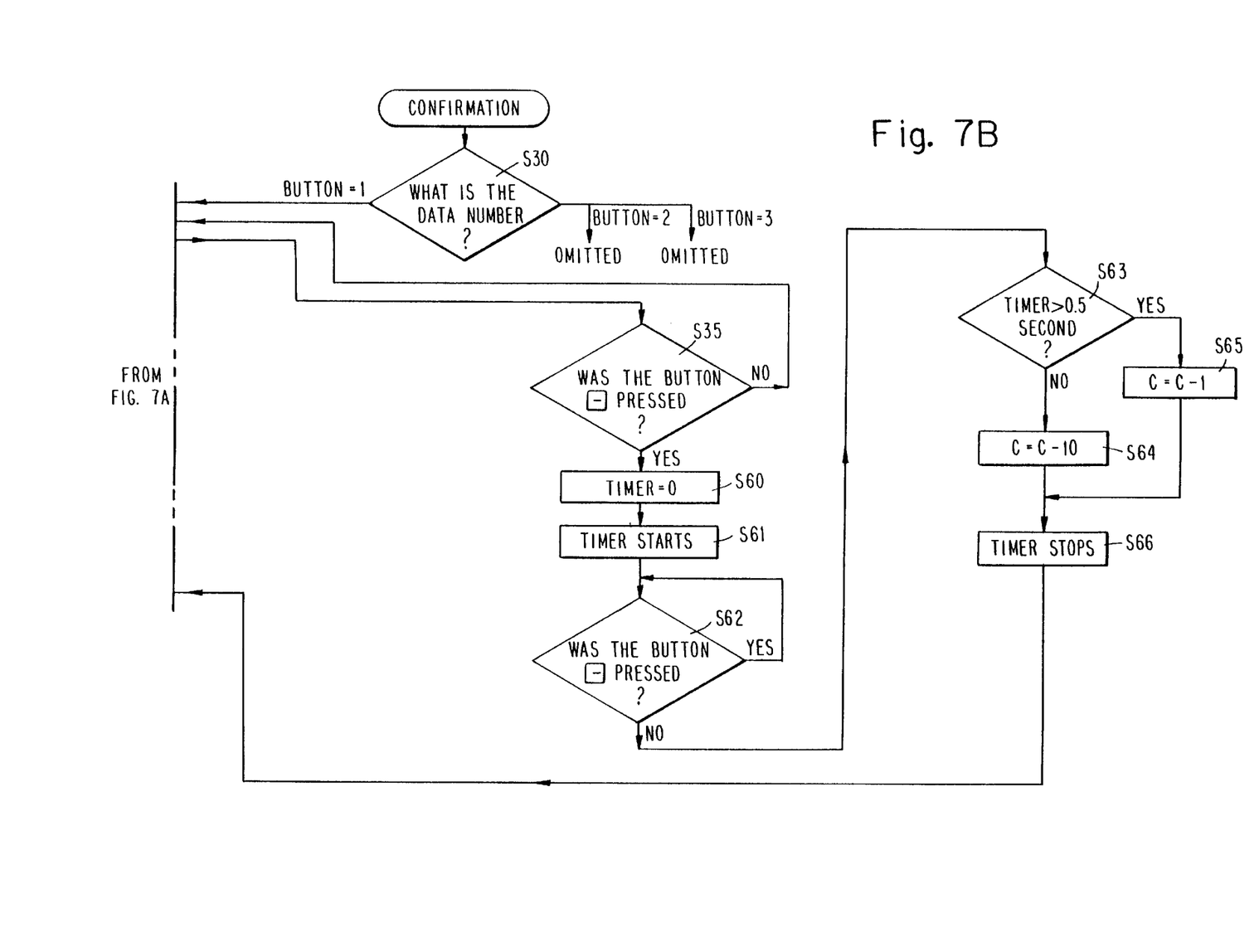

The overall operation will subsequently be described by reference to flowcharts in FIGS. 4, 6 and 7. First, it is assumed that program reservation data for one day has been transferred from the disk 4 to the memory (not shown) of the PC 3 (personal computer) in FIG. 1. When one of the family members, for instance, the father goes out, he is to copy the program reservation data into his own wrist watch so that the program reservation data can be confirmed by means of the display of the wrist watch as occasion demands while he is out. Moreover, the program reservation data can be registered in the VCR 1 by remote control from the place where he is staying as occasion demands, with the means made known by Japanese Patent No. 63-36183 of the present applicant, for instance. However, the description of this specific remote control process will be omitted in the specification of the present invention as it has already been made known in the Japanese Patent stated above.

When the family member (father) presses the button ⊡ 20 (FIG. 2-1) of the wrist watch 9, a remote control signal, i.e., the coded infrared ray is emitted from the light emitting diode 9-1 (FIGS. 1 and 2). The remote control signal, which is equivalent to a data transmission instruction, received by the phototransistor 7-4 provided in the display unit (FIG. 1) is applied via the interface 6 to the PC 3 and the program used to display the program reservation data on the display unit 7 is then switched over by an interrupt operation to what is represented by a flowchart of FIG. 4 illustrating the process of transmitting the program reservation data from the PC 3 to the wrist watch 9.

Figure 21:
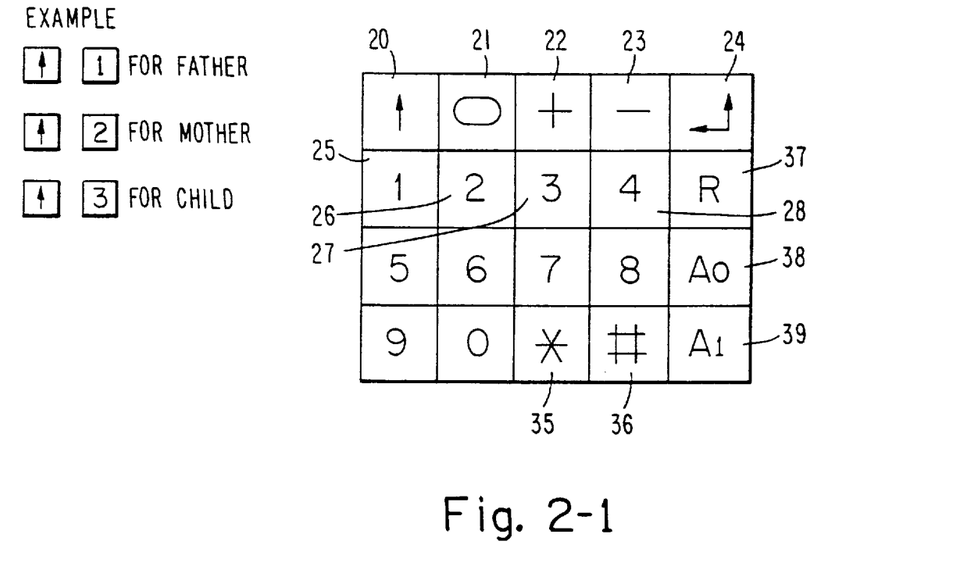

Step S2 follows when the remote control signal is a data transmission instruction in Step S1. As "1" has been allocated as a data number to the family member (father), the button ⊡ 25 is pressed (FIG. 2-1). The pertinent remote control signal is transmitted from the light emitting diode 9-1 at this time and received via the phototransistor 7-4. Then Step S3 follows, wherein a top address in the RAM for data No. 1 is designated. The top address is the one preset by the program (not shown) in the PC 3 as an area where the program reservation data for the father, mother and child of a family are stored.

Figure 51:
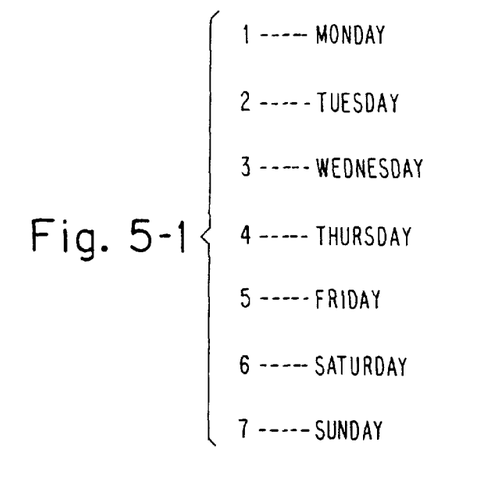

The contents of the program reservation data are arranged on the RAM as shown in FIG. 5. More specifically, "FD" (hexadecimal) as a data initiating mark, for instance, is entered in 50, and "1" as a data number for the father, "2" for the mother or "3" for the child is entered in 51 respectively. Further, 52 refers to a program No., which is registered in the order of reservation; 53 to a channel number; 54 and 55 to the time at which video recording starts and ends, thus possessing two bytes respectively; 56 to a day of the week in the form of a numerical value shown in FIG. 5-1 on which video recording is made, for instance, "7" designating Sunday; 57 to a daily or weekly video recording to be allocated, "1" and "2" designating daily and weekly video recording respectively; 58 to tape speed to be allocated, "1" and "2" designating standard and trebled speeds respectively; and 59 to a data end mark indicating the termination of data setting described above, for instance, "FF" (hexadecimal) being recorded.

In Step S4, whether the data initiating mark 50 of those recorded exists in the RAM is tested. As long as the program reservation data for the family member (father) exists in the RAM, Step S4 becomes "YES" and the following Step S5 follows in order to read one-byte data. The data thus read is supplied from the PC 3 to the interface 6 and then sent out from the light emitting diode 7-5 of the display unit 7 in the form of an infrared ray, which is received by the phototransistor 9-2 of the wrist watch 9 before being amplified by the amplifier 40 shown in FIG. 3. The signal thus amplified is subjected to waveform shaping in the waveform shaping circuit 41 and copied into the memory RAM 2 of CPU 42. The timepiece on the reception side will be described later by reference to a flowchart of FIG. 6.

Data transmission in Step S5 is repeated until the data end mark 59 is detected in Step S7 after the data initiating mark 50, i.e., one-byte data in the program reservation data, is sent out initially and the address is increased by 1 in Step S6. In other words, following the data initiating mark 50 shown in FIG. 5, the data number 51 is sent out and the following data are transmitted in order until the data end mark 59 is detected. If one set of program reservation data thus transmitted is followed by the next one, it is assumed that the next program reservation data initiating mark exists in the address next to the data end mark 59. Therefore, Step S4 becomes "YES" and the following program reservation data are to be sequentially transmitted. Unavailability of any program reservation data next to the data end mark means nonexistence of the next data initiating mark. If so, Step S4 becomes "NO" and Step S9 follows, where the beep tone is amplified to inform the completion of the copy of program reservation data.

If program reservation data for another member (e.g., mother) is desired to be copied into the wrist watch 9, it is only needed to press the button ② 26 after the button ① 20. There may be arranged a program for having program reservation data for all members of the family copied into the wrist watch 9 by pressing only the button ① 20, for instance, or when the button Ⓜ is pressed after the button ① 20 is pressed, not shown in the flowchart though.

Reception of the program reservation data on the part of the wrist watch 9 will further be described by reference to the flowchart of FIG. 6. When the button ① 25 is pressed after the button ① 20 is pressed, the pertinent area for use in the RAM 2 is to be cleared beforehand in Step S11. Step S12 becomes "YES" when the aforementioned data initiating mark is detected, the data initiating mark being supplied from the PC 3 (personal computer) that has received the remote control signal as the button ① is pressed. In the following Step S13, the received data starting with the data initiating mark 50 (FIG. 5) is copied at a designated address of the memory RAM 2. Further, Step S13 follows again unless the aforementioned data end mark is detected in Step S15 after the address of the RAM 2 is increased by 1 in Step S14, and the next reception data, that is, the aforementioned data number 51 is copied into the RAM 2. When the data end mark is detected in Step S15 after the operation stated above is repeated, the data end mark is copied into the RAM 2 in Step S16. The address is increased by 1 in Step S17 and whether the data initiating mark exists is tested in Step S18. When a plurality of program reservation data are received, Step S18 becomes "YES" at the reception of the next data initiating mark following the data end mark. In Step S19, the data initiating mark is copied in the memory RAM 2, and Step S13 follows again via Step S20. If the data initiating mark is not detected in Step S18, Step S18 becomes "NO," and "END" is displayed on the display 9-3 in Step S21, whereby this routine is terminated.

In the present invention, the contents of the program reservation data thus received can be confirmed by means of the display 9-3 of the wrist watch 9 as stated above. More specifically, the program reservation data for the father is so arranged that it can be displayed on the display 9-3 (FIG. 2) if the operating button ① 25 is pressed immediately after the operating button ⊟ 21 of FIG. 2-1 is pressed. When the operating button 21 is pressed, a subroutine of FIG. 7 is called according to the program. When the operating button 25 is subsequently pressed, the process flow transfers from Step S30 to Step S31. The designation is made to an address at which the initial channel number of the memory RAM 2 containing the program reservation data for the father is recorded (initialization of the address). The channel number is displayed as "CH:10," for instance, on the display 9-3 of the wrist watch (Step S32). In Step S33, a variable C for a counter to be used for reading given data is set at "2." The following Step S34 and Step S35 are looped unless either the button ⊞ 22 or the button ⊟ 23 (FIG. 2-1) is pressed, and the channel number is held displayed while these Steps are looped. When the button ⊞ 22 is pressed to view the next data, Step S34 becomes "YES" and Step S36 follows. By first clearing a timer (not shown) for measuring the time period during which the button ⊞ is held pressed, the timer being built in the CPU 42 for the wrist watch 9 is started (Step S37). The following Step S38 becomes "NO" if the button ⊞ 22 is released from being pressed, and then Step S39 follows. At this time, whether the passage of time measured by the timer exceeds 0.5 second is tested. In other words, Step S39 becomes "YES" if the button ⊞ 22 is pressed for over 0.5 second, and then Step S40 follows, where the counter C is increased by 10. When the button ⊞ 22 is released from being pressed within 0.5 second, however, Step S39 becomes "NO" and Step S41 follows, where the counter C is increased by 1. Consequently, the count in the counter C changes from "2" in Step S33 to "3" in Step S41 if the button ⊞ 22 is released from being pressed within 0.5 second and Step S46 follows via Step S42 and Step S43. At this time, video recording start time as the next data is displayed as "START: PM07: 00," for instance. If the button ⊞ 22 is pressed for over 0.5 second while the aforementioned channel number is displayed, the count in the counter C becomes "2+10=12" and the next channel number can be displayed as the data situated therebetween are skipped, though this process flow is not indicated in the flowchart. If any data to be displayed is not present, "END" is displayed (not shown).

When the button ⊟ 23 is pressed, on the other hand, the counter C is decreased by 1 or 10, depending on the time period during which it is held pressed, and the pertinent data can be displayed. Since the operation is similar to the one when the button ⊞ 22 is pressed, the detailed description thereof will be omitted.

As set forth above, the program reservation data can be confirmed as occasion demands by means of the display of the wrist watch. When it is unnecessary for the program reservation data to be confirmed, the clock display button 24 of FIG. 2-1 is set so that time can be indicated on the display when the button is pressed. The display can be so arranged as to automatically switch itself over to time display when the operation for displaying the program reservation data is otherwise not performed within a predetermined time period.

Figure 8:
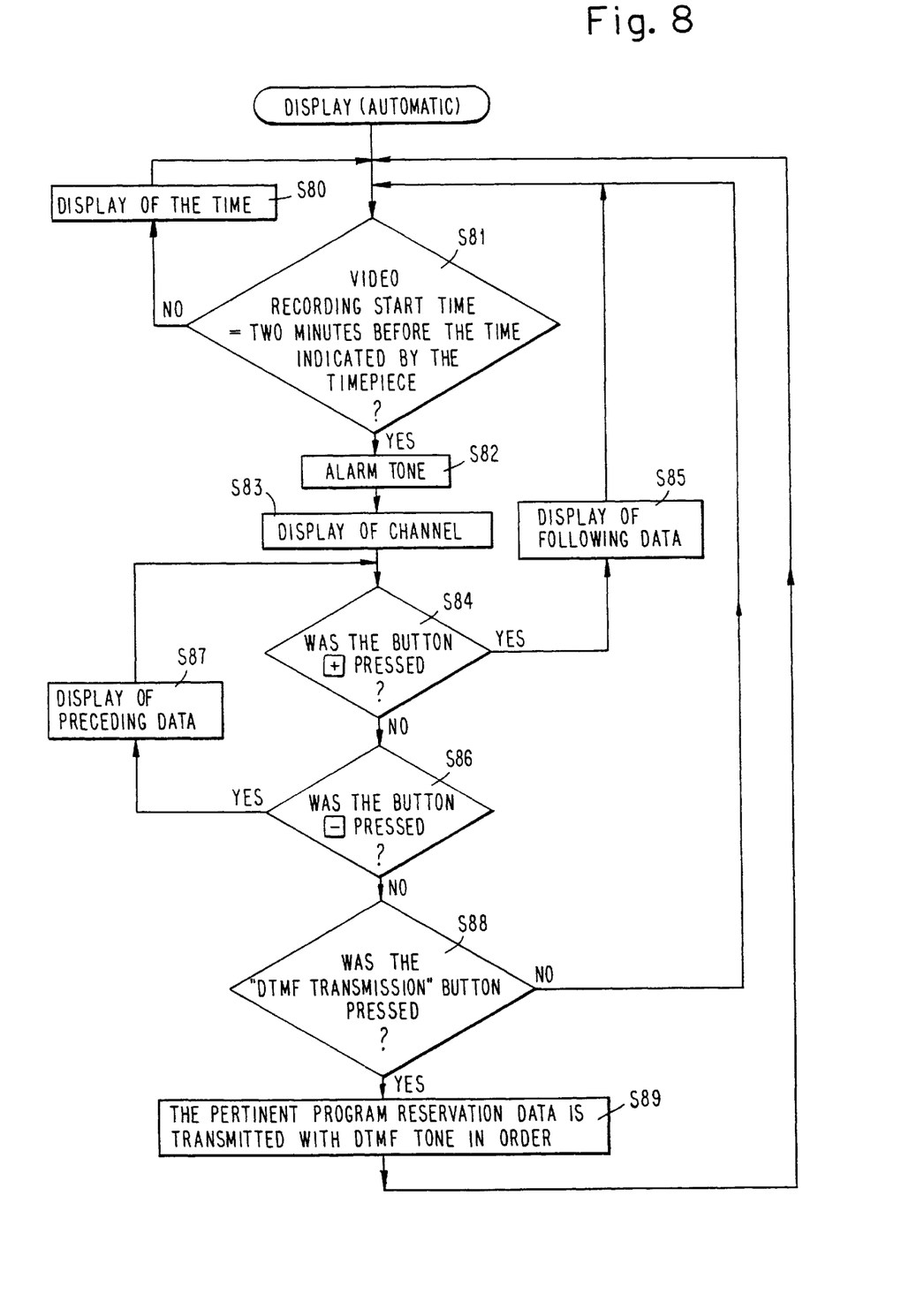
FIG. 8 is a flowchart illustrating the operations performed when part of TV program reservation data is displayed as the video recording start time stored in the timepiece approaches the time indicated by the timepiece.

Referring to a flowchart of FIG. 8, data corresponding to the pertinent program reservation data is to be displayed with an alarm tone, for instance, two minutes before the time at which the tape recording of the program reservation data is started as indicated on the display 9-3 of the wrist watch; that is, as Step S80 and Step S81 are looped, time is always indicated in Step S80. In addition, Step S81 becomes "YES" two minutes before the time at which the tape recording of the program reservation data copied in the memory RAM 2 of the wrist watch is started as described above and Step S82 follows. The built-in alarm of the wrist watch 9 is then caused to sound for a predetermined time and the pertinent channel contained in the program reservation data is indicated (Step S83). Although not illustrated in the flowchart, the alarm tone can be produced at predetermined intervals until the corresponding time is reached. As Steps S84–S88 are looped, moreover, the following or preceding data can be displayed for confirmation by pressing the button ⊞ 22 and button ⊟ 23 (FIG. 2-1). It the video cassette recorder VCR 1 (FIG. 1) is desired to be operated by the program reservation data, the user may call his/her home by telephone from the place where he/she is staying so as to transmit the program reservation data with a dual-tone multifrequency (DTMF) signal in Step S89 by coupling the wrist watch 9 to the telephone and pressing a DTMF transmission button (A1, 39 in FIG. 2-1). The tone is decoded by a DTMF tone decoder 11 of FIG. 1 and the decoded data is registered in the VCR 1 via the PC 3 and the interface 5. As controlling of the VCR 1 at this time has already made known in Japanese Patent No. 63-36183, U.S. Pat. No. 4,540,851 and the like by the present applicant, the detailed description thereof will be omitted.

In consideration of a limited space, a sound source 47 (FIG. 3) for transmitting the DTMF tone is attached to the portion called a buckle on the back surface of the wrist watch 9.

The pertinent program reservation data can be displayed, provided Step S81 becomes "YES" by changing time through the built-in time setting function of the wrist watch.

As set forth above, the present invention is of great practical use in that existing physical constraints, which restrict the attempts to check TV programs only to the possession of individual program timetables, are relaxed, whereby such TV programs corresponding to the contents of data stored in individual timepieces such as wrist watches can be displayed.

What is claimed is:

1. An apparatus for setting identification data of television programs, comprising:

a television receiver for receiving television programs, selector means for selecting a desired television program from among all television programs to be received by said television receiver, identification display means for displaying identification data of the selected program for a group of users, a personal computer for controlling said selector means and said identification display means, and for storing television program identification data for said group of users, said personal computer being a unit separate from said selector means and said identification display means, interface means for interfacing the personal computer with said selector means and said identification display means, portable display means built into a wristwatch of at least one of the users for receiving from the identification display means the television program identification data at a location remote with respect to the identification display means, said portable display means including transmission request means for entering a request for transmission of the television program identification data for a member of said group of users, said personal computer being responsive to said request by transmitting to said portable display means the television program identification data for the member of said group indicated in said request, and transfer means for transferring the television program identification data to said portable display means to display the television program identification data for the member of the group indicated in said request.

2. The apparatus of claim 1, wherein said portable display means comprises a timer responsive to the identification data.

3. The apparatus of claim 2, wherein said timer comprises alarm means for generating an alarm prior to recording in response to the identification data.

4. The apparatus of claim 1, wherein said portable display means comprises means for electrically coupling said portable display means to said personal computer through a telephone for transmitting a DTMF signal to control said selector means.

5. The apparatus of claim 1, wherein said transfer means comprises means for bi-directional optical transmission.

6. The apparatus of claim 1, wherein said portable display means comprises means for storing the identification data.

7. The apparatus of claim 1, wherein the displayed identification data of the selected program are transferred to said portable display means in response to a request of said at least one of the users transmitted from said portable display means to said identification display means.

8. The apparatus of claim 1, wherein said identification display means displays an identification information of the selected program for each of the users.

9. The apparatus of claim 8, wherein said portable display means receives from said identification display means the displayed identification information provided for said at least one of the users.

\* \* \* \* \*